US006739424B2

(12) United States Patent
Ogura et al.

(10) Patent No.: US 6,739,424 B2
(45) Date of Patent: May 25, 2004

(54) SPEAKER SYSTEM

(75) Inventors: Takashi Ogura, Osaka (JP); Kosaku Murata, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/054,339

(22) Filed: Jan. 22, 2002

(65) Prior Publication Data

US 2002/0134613 A1 Sep. 26, 2002

(30) Foreign Application Priority Data

Jan. 22, 2001 (JP) ....................................... 2001-012746

(51) Int. Cl.[7] .................................................. H05K 5/00

(52) U.S. Cl. ......................... 181/145; 381/89; 381/335; 381/387

(58) Field of Search .......................... 381/89, 335, 339, 381/342, 182, 387; 181/144, 145, 147, 264, 148–156, 163, 166

(56) References Cited

U.S. PATENT DOCUMENTS

| | | | | | |
|---|---|---|---|---|---|
| 3,898,384 | A | * | 8/1975 | Goeckel | 381/342 |
| 3,918,551 | A | * | 11/1975 | Rizo-Patron | 181/144 |
| 4,283,605 | A | | 8/1981 | Nakajima | |
| 4,430,529 | A | | 2/1984 | Nakagawa et al. | |
| 4,654,554 | A | | 3/1987 | Kishi | |
| 4,733,749 | A | * | 3/1988 | Newman et al. | 181/144 |
| 4,751,419 | A | | 6/1988 | Takahata | |
| 4,923,031 | A | * | 5/1990 | Carlson | 181/144 |
| 4,969,197 | A | | 11/1990 | Takaya | |
| 5,031,222 | A | | 7/1991 | Takaya | |
| 5,196,755 | A | | 3/1993 | Shields | |
| 5,253,301 | A | * | 10/1993 | Sakamoto et al. | 381/89 |
| 5,386,479 | A | * | 1/1995 | Hersh | 381/190 |
| 5,561,717 | A | * | 10/1996 | Lamm | 381/89 |
| 5,621,804 | A | * | 4/1997 | Beppu | 381/332 |
| 5,761,324 | A | | 6/1998 | Kanai et al. | |
| 5,847,331 | A | * | 12/1998 | Vollmer et al. | 181/147 |
| 5,850,460 | A | * | 12/1998 | Tanaka et al. | 381/186 |
| 6,088,459 | A | * | 7/2000 | Hobelsberger | 381/96 |
| 6,431,308 | B1 | * | 8/2002 | Vollmer et al. | 181/144 |

FOREIGN PATENT DOCUMENTS

| | | |
|---|---|---|
| EP | 0 429 121 A | 5/1991 |
| EP | 0 999 723 A2 | 5/2000 |
| JP | 53-87642 | 12/1976 |
| JP | 53-76823 | 7/1978 |
| JP | 55-137199 | 9/1980 |

(List continued on next page.)

OTHER PUBLICATIONS

European Search Report dated Dec. 2, 2003, for EP 02 00 1039 (3 pages).

*Primary Examiner*—Robert Nappi
*Assistant Examiner*—David S. Warren
(74) *Attorney, Agent, or Firm*—RatnerPrestia

(57) ABSTRACT

A speaker system includes a first speaker; a second speaker; and a first spacer for separating the first speaker and the second speaker from each other so that the first speaker and the second speaker face each other. The first speaker and the second speaker are located so that opposing faces of the first speaker and the second speaker output sounds of an identical phase. The first speaker, the second speaker and the first spacer form a first sound path through which the sounds output from the opposing faces of the first speaker and the second speaker pass. The speaker system according to the present invention includes n number speakers and (n−1) number of spacers and can be arranged so that the opposing faces of even-numbered speakers and odd-numbered speakers output sounds of an identical phase.

43 Claims, 12 Drawing Sheets

FOREIGN PATENT DOCUMENTS

| | | |
|---|---|---|
| JP | 58-82091 | 6/1983 |
| JP | 58-105699 | 6/1983 |
| JP | 58-100000 | 7/1983 |
| JP | 60-177798 | 9/1985 |
| JP | 60-200700 | 10/1985 |
| JP | 63-116600 | 5/1988 |
| JP | 63-257400 | 10/1988 |
| JP | 9-271096 | 10/1997 |
| JP | 55-51579 | 9/1998 |
| WO | WO 98/28942 | 7/1998 |

* cited by examiner

SPEAKER SYSTEM

BACKGROUND OF THE INVENTION

1. Field of the Invention

The present invention relates to a speaker system used for, for example, audio equipment.

2. Description of the Related Art

A speaker outputs sound by vibrating a vibrating plate and thus changing the pressure of the surrounding air (sound pressure).

In the case where a single speaker does not provide a sufficient sound pressure, a desired sound pressure can be obtained by synthesizing sounds output from a plurality of speakers.

FIG. 12 is a plan view of a conventional speaker system 1200 including four speakers. The speaker system 1200 includes a first speaker 1201, a second speaker 1202, a third speaker 1203 and a fourth speaker 1204 which are provided on a planar baffle plate 1210.

FIG. 13 is a graph illustrating the relationship between the number of speakers and an increase in sound pressure. The increase in sound pressure is defined as a difference between a synthesized sound pressure from an arbitrary number of speakers and sound pressure output from a single speaker, and is represented in units of dB. The graph shown in FIG. 13 is given by the following theoretical expression, where L is assumed to be 70 dB.

$$L_p(a) := 20 \cdot \log\left(a \cdot 10^{\frac{L}{20}}\right) - L$$

a:=1 . . . 10

L:=70 dB

Table 1 shows specific values given by the above theoretical expression.

| a = | Lp(a) = |
|---|---|
| 1 | $-1.421 \cdot 10^{-14}$ |
| 2 | 6.021 |
| 3 | 9.542 |
| 4 | 12.041 |
| 5 | 13.979 |
| 6 | 15.563 |
| 7 | 16.902 |
| 8 | 18.062 |
| 9 | 19.085 |
| 10 | 20 |

As shown in FIG. 13 and Table 1, as the number of speakers increases, the sound pressure increases.

The conventional speaker system 1200 including a plurality of speakers on a planar area has the following problem. When the speaker system is located in a space, for example, in a space within a vehicle, on a wall of a room or on a table, which has a limited surface area, the number of speakers which can be located is limited. As a result, the sound pressure cannot be increased as desired.

SUMMARY OF THE INVENTION

A speaker system according to the present invention includes a first speaker; a second speaker; and a first spacer for separating the first speaker and the second speaker from each other so that the first speaker and the second speaker face each other. The first speaker and the second speaker are located so that opposing faces of the first speaker and the second speaker output sounds of an identical phase. The first speaker, the second speaker and the first spacer form a first sound path through which the sounds output from the opposing faces of the first speaker and the second speaker pass.

In one embodiment of the invention, the first sound path is formed so that a transfer direction of the sounds passing through the first sound path is perpendicular to amplitude direction of vibrations of the first speaker and the second speaker.

In one embodiment of the invention, the speaker system further includes at least one baffle plate, which is provided so that the sounds passing through the first sound path is directed to a direction parallel to the amplitude direction of vibrations of the first speaker and the second speaker.

In one embodiment of the invention, the speaker system further includes at least one baffle plate, which is provided so that the sounds passing through the first sound path is directed to a direction perpendicular to the amplitude direction of vibrations of the first speaker and the second speaker.

In one embodiment of the invention, the speaker system further includes a third speaker; and a second spacer for separating the second speaker and the third speaker from each other so that the second speaker and the third speaker face each other. The second speaker and the third speaker are located so that opposing faces of the second speaker and the third speaker output sounds of an identical phase. The second speaker, the third speaker and the second spacer form a second sound path through which the sounds output from the opposing faces of the second speaker and the third is speaker pass.

In one embodiment of the invention, the second sound path is formed so that a transfer direction of the sounds passing through the second sound path is perpendicular to amplitude direction of vibrations of the second speaker and the third speaker.

In one embodiment of the invention, the speaker system further includes at least one baffle plate, which is provided so that the sounds passing through the second sound path is directed to a direction parallel to the amplitude direction of vibrations of the second speaker and the third speaker.

In one embodiment of the invention, the speaker system further includes at least one baffle plate, which is provided so that the sounds passing through the second sound path is directed to a direction perpendicular to the amplitude direction of vibrations of the second speaker and the third speaker.

In one embodiment of the invention, the first sound path and the second sound path are formed so that the transfer direction of the sounds passing through the first sound path and the transfer direction of the sounds passing through the second sound path are opposite to each other.

In one embodiment of the invention, the first speaker and the second speaker have an identical structure; the first speaker and the second speaker are located so that a front face of the first speaker and a front face of the second speaker face each other or so that a rear face of the first speaker and a rear face of the second speaker face each other; and the first speaker and the second speaker are vibrated with an identical phase.

In one embodiment of the invention, the first speaker and the second speaker have an identical structure; the first speaker and the second speaker are located so that a front face of the first speaker and a rear face of the second speaker face each other or so that a rear face of the first speaker and a front face of the second speaker face each other; and the first speaker and the second speaker are vibrated with opposite phase.

In one embodiment of the invention, the first speaker and the second speaker are each a piezoelectric speaker including a piezoelectric element; a polarization direction of the piezoelectric element of the first speaker is opposite to a polarization direction of the piezoelectric element of the second speaker; and a phase of an electric signal input to the first speaker is identical with a phase of an electric signal input to the second speaker.

In one embodiment of the invention, a phase of an electric signal input to the first speaker is opposite to a phase of an electric signal input to the second speaker.

In one embodiment of the invention, the first speaker and the second speaker each include a frame; a vibrating plate; a piezoelectric element provided on the vibrating plate; a damper connected to the frame and the vibrating plate for supporting the vibrating plate so that the vibrating plate is linearly vibratile; and an edge provided so as to fill a gap between the vibrating plate and the frame. The damper acts as an electrode.

In one embodiment of the invention, the first speaker and the second speaker are each a dynamic speaker.

Thus, the invention described herein makes possible the advantages of providing a speaker system for increasing the sound pressure using a plurality of speakers while maintaining the same surface area as that of a single speaker.

These and other advantages of the present invention will become apparent to those skilled in the art upon reading and understanding the following detailed description with reference to the accompanying figures.

DESCRIPTION OF THE EMBODIMENTS

Hereinafter, the present invention will be described by way of illustrative examples with reference to the accompanying drawings.

1. Structure of the Speaker System

In the following description, piezoelectric speakers are used as a specific example of speakers, which are elements of the speaker system unless otherwise specified. However, the speakers according to the present invention are not limited to piezoelectric speakers. Speakers which have a vibrating plate and generate opposite-phase sounds on two sides of the vibrating plate, such as, for example, dynamic speakers, static speakers, or electromagnetic speakers, can be arranged in the same manner and provide the same effects as the piezoelectric speakers described below.

Figure 1:
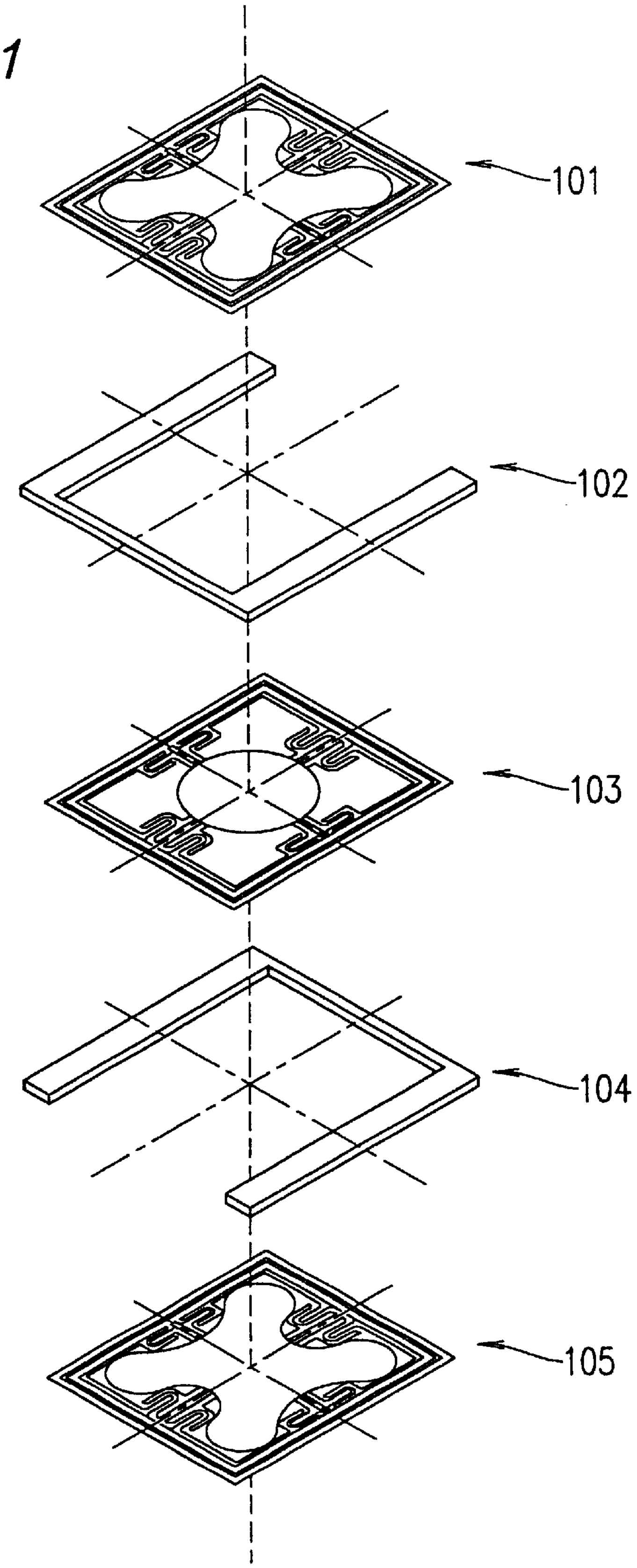
FIG. 1 is an exploded isometric view illustrating elements of a speaker system 100 according to the present invention.

FIG. 1 is an exploded isometric view of a speaker system 100 according to an example of the present invention.

The speaker system 100 includes a first speaker 101, a second speaker 103, a third speaker 105, a first spacer 102 provided between the first speaker 101 and the second speaker 103, and a second spacer 104 provided between the second speaker 103 and the third speaker 105.

The first speaker 101, the second speaker 103 and the third speaker 105 are piezoelectric speakers having an identical physical structure.

The first speaker 101 and the second speaker 103 are located so that opposing faces of the first speaker 101 and the second speaker 103 output sounds of an identical phase. The second speaker 103 and the third speaker 105 are located so that opposing faces of the second speaker 103 and the third speaker 105 output sounds of an identical phase.

Due to such an arrangement, the phase of the sound output from the face of the second speaker 103 opposing the first speaker 101 is opposite to the phase of the sound output from the face of the second speaker 103 not opposing the first speaker 101. The phase of the sound output from the face of the third speaker 105 opposing the second speaker 103 is opposite to the phase of the sound output from the face of the third speaker 105 not opposing the second speaker 103.

The first spacer 102 is generally U-shaped; i.e., has a shape of a four-sided frame with one side missing. The first spacer 102 separates the first speaker 101 and the second speaker 103 from each other so that the first speaker 101 and the second speaker 103 face each other when the speaker system 100 is completed. The second spacer 104 is also generally U-shaped; i.e., has a shape of a four-sided frame with one side missing. The second spacer 104 separates the second speaker 103 and the third speaker 105 from each other so that the second speaker 103 and the third speaker 105 face each other when the speaker system 100 is completed.

In FIG. 1, the first spacer 102 and the second spacer 104 are arranged so that the missing sides of the first spacer 102 and the second spacer 104 are on the opposite sides when the speaker system 100 is completed.

Figure 2:
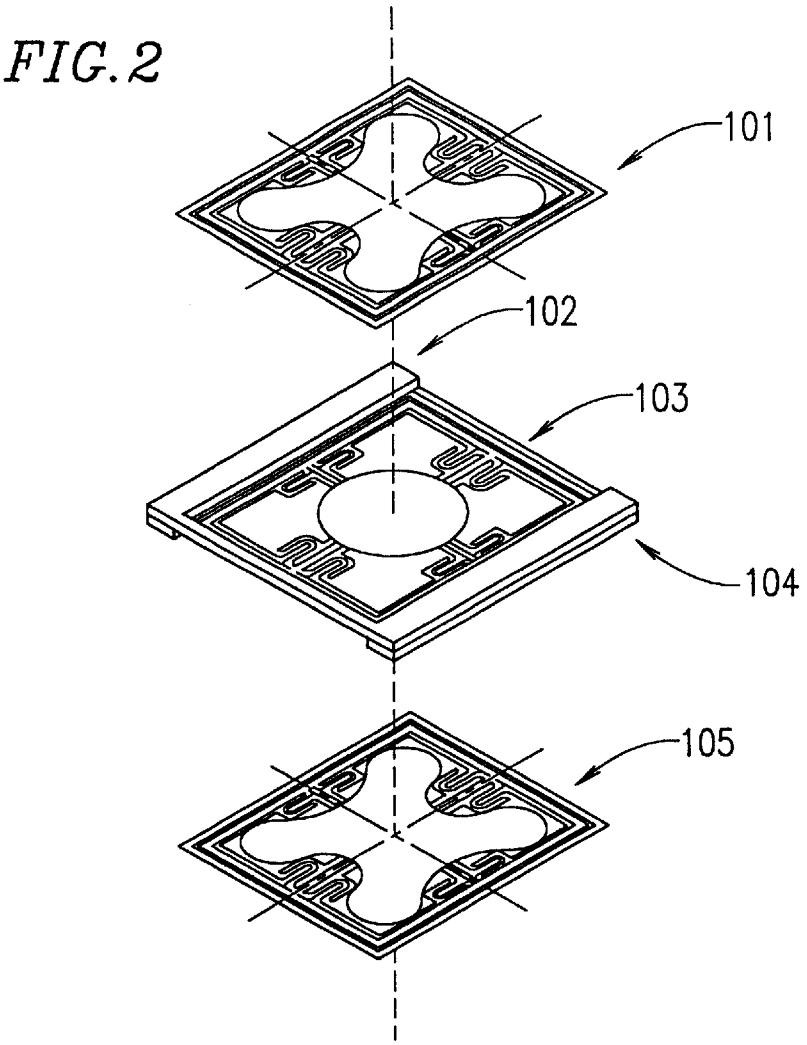
FIG. 2 is an exploded isometric view illustrating a step of a process for producing the speaker system 100.

FIG. 2 is an exploded isometric view illustrating a step of a process for producing the speaker system 100.

In FIG. 2, the first spacer 102 and the second spacer 104 are attached to the second speaker 103.

Figure 3:
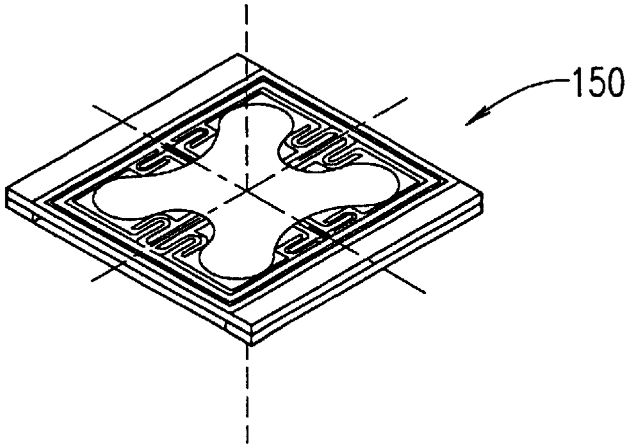
FIG. 3 is an isometric view illustrating another step of the process for producing the speaker system 100.

FIG. 3 is an isometric view illustrating another step of the process for producing the speaker system 100.

In FIG. 3, the first speaker 101 is attached to the first spacer 102 already having the second speaker 103 attached thereto, and the third speaker 105 is attached to the second spacer 104 already having the second speaker 103 attached thereto. In this manner, a speaker body 150 is produced. At least one baffle plate (not shown in FIG. 3; see FIG. 4) is attached to the speaker body 150, thus completing the speaker system 100.

Figure 4:
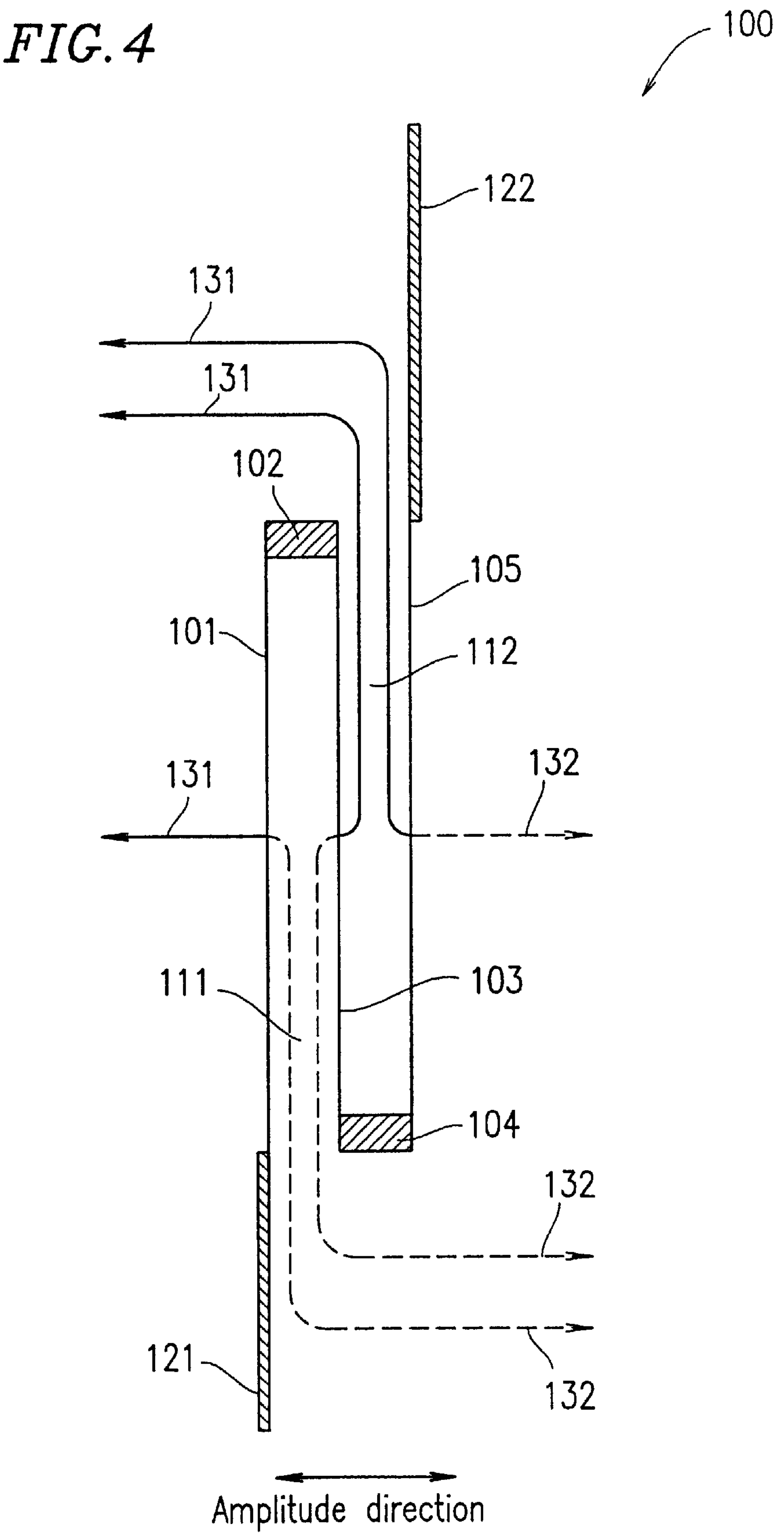
FIG. 4 is a cross-sectional view of the speaker system 100.

FIG. 4 is a cross-sectional view of the speaker system 100. In the example shown in FIG. 4, the first speaker 101 is provided with a first baffle plate 121, and the third speaker 105 is provided with a second baffle plate 122.

The first speaker 101, the second speaker 103, and the third speaker 105 vibrate so as to produce sound. The arrows in FIG. 4 labeled "Amplitude direction" show an amplitude direction of vibrations of the first speaker 101, the second speaker 103, and the third speaker 105. The first speaker 101, the second speaker 103, and the third speaker 105 are arranged in the amplitude direction.

The first speaker 101, the second speaker 103 and the first spacer 102 form a first sound path 111 through which the sounds output from the opposing faces of the first speaker 101 and the second speaker 103 pass.

The second speaker 103, the third speaker 105 and the second spacer 104 form a second sound path 112 through which the sounds output from the opposing faces of the second speaker 103 and the third speaker 105 pass.

The first sound path 111 is formed so that a transfer direction of the sounds passing through the first sound path 111 is perpendicular to the amplitude direction of vibrations of the first speaker 101 and the second speaker 103.

The second sound path 112 is formed so that a transfer direction of the sounds passing through the second sound path 112 is perpendicular to the amplitude direction of vibrations of the second speaker 103 and the third speaker 105.

The first sound path 111 and the second sound path 112 are preferably formed so that the transfer direction of the sounds passing through the first sound path 111 and the transfer direction of the sounds passing through the second sound path 112 are opposite to each other (i.e., different by 180 degrees). The speaker system 100 having the first sound path 111 and the second sound path 112 arranged in this manner is more easily installed than a speaker system in which the transfer directions of the sounds passing through the two sound paths are the same or different by 90 degrees.

The sounds output from the opposing faces of the first speaker 101 and the second speaker 103 pass through the first sound path 111, which is a space defined by the first speaker 101, the second speaker 103 and the first spacer 102, and are then transferred to the outside of the speaker system 100 through the missing side of the first spacer 102.

The sounds output from the opposing faces of the second speaker 103 and the third speaker 105 pass through the second sound path 112, which is a space defined by the second speaker 103, the third speaker 105 and the second spacer 104, and are then transferred to the outside of the speaker system 100 through the missing side of the second spacer 104.

The speaker system 100 has two sound paths (the first sound path 111 and the second sound path 112). Sounds having opposite phase are transferred through the two sound paths. The reason is as follows. The second speaker 103 simultaneously outputs sounds having opposite phase from two opposite faces thereof (i.e., the left face and the right face in FIG. 4). In addition, the first speaker 101 and the second speaker 103 are arranged so that the opposing faces thereof output sounds of an identical phase, and the second speaker 103 and the third speaker 105 are arranged so that the opposing faces thereof output sounds of an identical phase.

In this specification, the faces of each speaker will be defined as follows for the sake of convenience. The face to the left in the figures will be defined as the "left face", and the face to the right in the figures will be defined as the "right face".

Sound output from the left face of the first speaker 101 is transferred in a direction parallel to the amplitude direction of vibrations of the first speaker 101. Sound output from the right face of the second speaker 103 and sound output from the left face of the third speaker 105 are transferred through the second sound path 112. The sounds transferred through the second sound path 112 are directed by the second baffle plate 122 to the direction parallel to the amplitude direction of vibrations of the second speaker 103 and the third speaker 105 (i.e., the same direction as the transfer direction of the sound output from the left face of the first speaker 101). The phase of the sound output from the left face of the first speaker 101 is identical with the phase of the sounds transferred through the second sound path 112.

Therefore, the sound pressure is increased by synthesizing the sound output from the left face of the first speaker 101 and the sounds transferred through the second sound path 112. In FIG. 4, the flow of these sounds is represented by solid lines 131.

Sound output from the right face of the third speaker 105 is transferred in a direction parallel to the amplitude direction of vibrations of the third speaker 105. Sound output from the right face of the first speaker 101 and sound output from the left face of the second speaker 103 are transferred through the first sound path 111. The sounds transferred through the first sound path 111 are directed by the first baffle plate 121 to the direction parallel to the amplitude direction of vibrations of the first speaker 101 and the second speaker 103 (i.e., the same direction as the transfer direction of the sound output from the right face of the third speaker 105). The phase of the sound output from the right face of the third speaker 105 is identical with the phase of the sounds transferred through the first sound path 111.

Therefore, the sound pressure is increased by synthesizing the sound output from the right face of the third speaker 105 and the sounds transferred through the first sound path 111. In FIG. 4, the flow of these sounds is represented by dashed lines 132.

The first baffle plate 121 and the second baffle plate 122 are provided so that the flow of sounds represented by the solid lines 131 and the flow of sounds represented by the dashed lines 132 are not mixed together. Thus, the flow of sounds represented by the solid lines 131 and the flow of sounds represented by dashed lines 132 are prevented from counteracting each other and thus prevented from reducing the sound pressure.

A user of the speaker system 100 can listen to the flow of sounds represented by the solid lines 131 or the flow of sounds represented by the dashed lines 132.

It should be noted that herein, the expression "transfer direction of the sound" is defined as a fundamental transfer direction of the sound and does not mean that all sound is transferred only in this direction. The reason is because sound has a property of being transferred while being diffracted or reflected. Accordingly, the solid lines 131 and the dashed lines 132 conceptually show the passages of the sounds.

Figure 5:
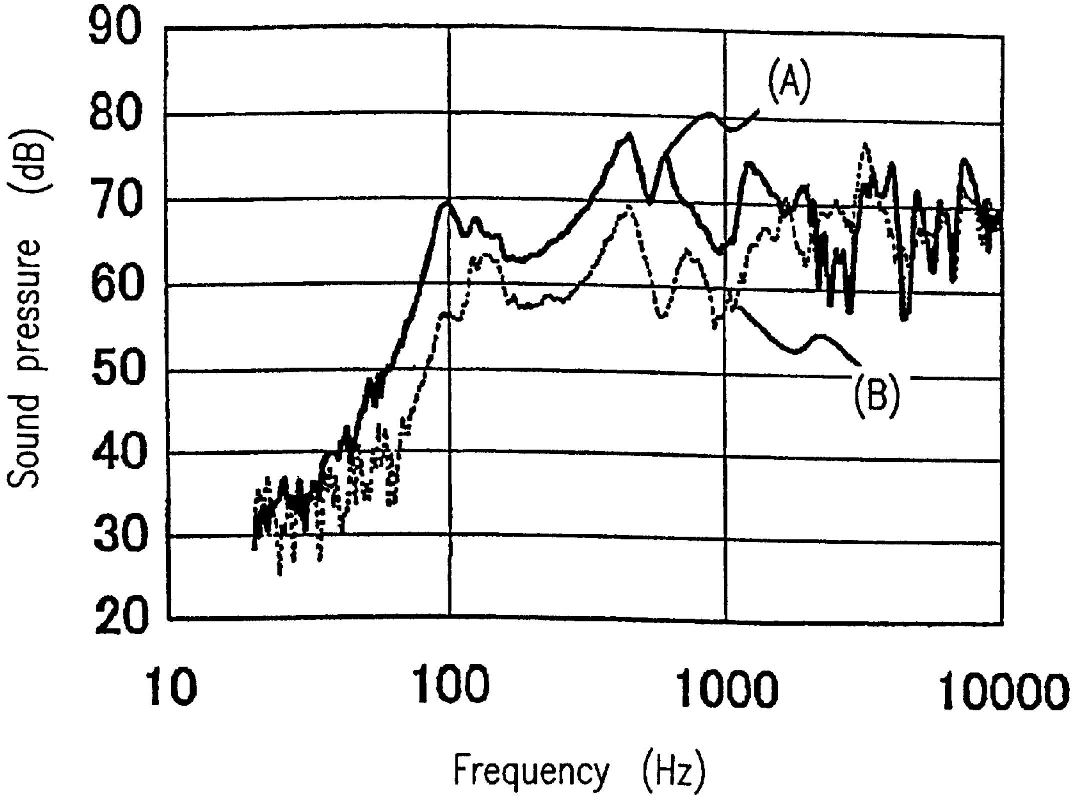
FIG. 5 is a graph illustrating the acoustic characteristics of the speaker system 100 and one speaker included in the speaker system 100, the acoustic characteristics being measured in a speaker box produced in compliance with a JIS standard.

FIG. 5 is a graph illustrating the acoustic characteristics of the speaker system 100 according to the present invention and one of the speakers included in the speaker system 100 which are measured in a speaker box produced in compliance with a JIS standard. The horizontal axis represents frequency, and the vertical axis represents sound pressure.

In FIG. 5, solid curve (A) represents a pressure-frequency characteristic of the speaker system 100, and dashed curve (B) represents a pressure-frequency characteristic of one of the speakers (e.g., the first speaker 101). For measuring the acoustic characteristics, the speakers included in the speaker system 100 are each supplied with a voltage of 3.3 V.

As can be appreciated from solid curve (A) and dashed curve (B) of FIG. 5, the sound pressure from the speaker system 100 is higher than the sound pressure from the one speaker almost over the entire frequency range. Especially, the speaker system 100 outputs sound having high sound pressure in a lower frequency range.

The flow of the sound after being transferred through a sound path can be freely set in accordance with actual form of use. In the speaker system 100 described above with reference to FIGS. 1 through 4, sounds are transferred from the two sound paths 111 and 112 to the amplitude direction of vibrations of the three speakers 101, 103 and 105. The present invention is not limited to this. In a speaker system according to the present invention, the sound can be transferred from a sound path in an arbitrary direction, for example, a direction perpendicular to the amplitude direction of vibrations of the speakers.

Figure 6:
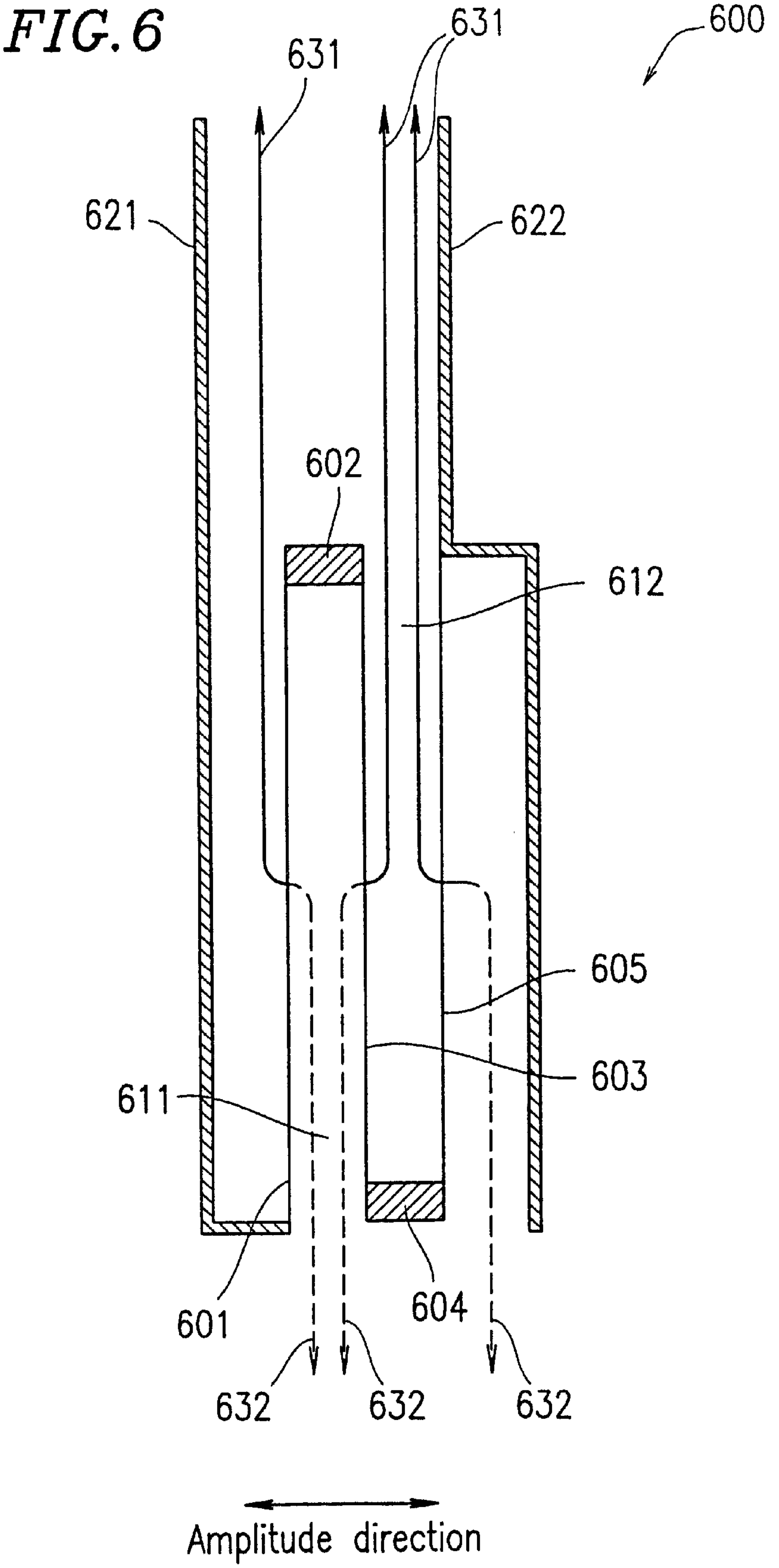
FIG. 6 is a cross-sectional view of a speaker system 600 according to the present invention, in which sounds are transferred in directions perpendicular to the amplitude direction of vibrations of the speakers.

FIG. 6 is a cross-sectional view of a speaker system 600 according to the present invention, in which sounds are transferred in directions perpendicular to the amplitude direction of vibrations of the speakers.

The speaker system 600 includes three speakers (a first speaker 601, a second speaker 603 and a third speaker 605) and two spacers (a first spacer 602 and a second spacer 604). The first spacer 602 separates the first speaker 601 and the second speaker 603 from each other so that the first speaker 601 and the second speaker 603 face each other. The second spacer 604 separates the second speaker 603 and the third speaker 605 from each other so that the second speaker 603 and the third speaker 605 face each other.

The first speaker 601, the second speaker 603, and the third speaker 605 vibrate so as to produce sound. The arrows in FIG. 6 labeled "Amplitude direction" show an amplitude direction of vibrations of the first speaker 601, the second speaker 603, and the third speaker 605. The first speaker 601, the second speaker 603, and the third speaker 605 are arranged in the amplitude direction.

The first speaker 601, the second speaker 603 and the first spacer 602 form a first sound path 611 through which the sounds output from the opposing faces of the first speaker 601 and the second speaker 603 pass.

The second speaker 603, the third speaker 605 and the second spacer 604 form a second sound path 612 through which the sounds output from the opposing faces of the second speaker 603 and the third speaker 605 pass.

The first sound path 611 is formed so that a transfer direction of the sounds passing through the first sound path 611 is perpendicular to the amplitude direction of vibrations of the first speaker 601 and the second speaker 603.

The second sound path 612 is formed so that a transfer direction of the sounds passing through the second sound path 612 is perpendicular to the amplitude direction of vibrations of the second speaker 603 and the third speaker 605.

The sounds output from the opposing faces of the first speaker 601 and the second speaker 603 pass through the first sound path 611, which is a space defined by the first speaker 601, the second speaker 603 and the first spacer 602, and are then transferred to the outside of the speaker system 600 through the missing side of the first spacer 602.

The sounds output from the opposing faces of the second speaker 603 and the third speaker 605 pass through the second sound path 612, which is a space defined by the second speaker 603, the third speaker 605 and the second spacer 604, and are then transferred to the outside of the speaker system 600 through the missing side of the second spacer 604.

The speaker system 600 further includes two baffle plates (a first baffle plate 621 and a second baffle plate 622).

Sound output from the left face of the first speaker 601 is directed by the first baffle plate 621 to a direction perpendicular to the amplitude direction of vibrations of the first speaker 601. Sound output from the right face of the second speaker 603 and sound output from the left face of the third speaker 605 are transferred through the second sound path 612. The sounds transferred through the second sound path 612 are directed by the second baffle plate 622 to the direction perpendicular to the amplitude direction of vibrations of the second speaker 603 and the third speaker 605 (i.e., the same direction as the transfer direction of the sound output from the left face of the first speaker 601). The phase of the sound output from the left face of the first speaker 601 is identical with the phase of the sounds transferred through the second sound path 612.

Therefore, the sound pressure is increased by synthesizing the sound output from the left face of the first speaker 601 and the sounds transferred through the second sound path 612. In FIG. 6, the flow of these sounds is represented by solid lines 631.

Sound output from the right face of the third speaker 605 is directed by the second baffle plate 622 to a direction perpendicular to the amplitude direction of vibrations of the third speaker 605. Sound output from the right face of the first speaker 601 and sound output from the left face of the second speaker 603 are transferred through the first sound path 611. The sounds transferred through the first sound path 611 are directed to the direction perpendicular to the amplitude direction of vibrations of the first speaker 601 and the second speaker 603 (i.e., the same direction as the transfer direction of the sound output from the right face of the third speaker 605). The phase of the sound output from the right face of the third speaker 605 is identical with the phase of the sounds transferred through the first sound path 611.

Therefore, the sound pressure is increased by synthesizing the sound output from the right face of the third speaker 605 and the sounds transferred through the first sound path 611. In FIG. 6, the flow of these sounds is represented by dashed lines 632.

The first baffle plate 621 and the second baffle plate 622 are provided so that the flow of sounds represented by the solid lines 631 and the flow of sounds represented by the dashed lines 632 are not mixed together. Thus, the flow of sounds represented by the solid lines 631 and the flow of sounds represented by the dashed lines 632 are prevented from counteracting each other and thus prevented from reducing the sound pressure.

As described above, the sounds output from the speakers can be transferred in a direction perpendicular to the amplitude direction of vibrations of the speakers. In this case, the sounds can be output to directions different from the directions parallel to the amplitude direction of vibrations of the speakers, which raises the freedom in installment of the speaker system.

The number of speakers included in a speaker system according to the present invention is not limited to three. The number of spacers included in a speaker system according to the present invention is not limited to two. A speaker system according to the present invention can include n number of speakers (where n is an integer equal to or greater than 2) and (n−1) number of spacers.

Figure 13:
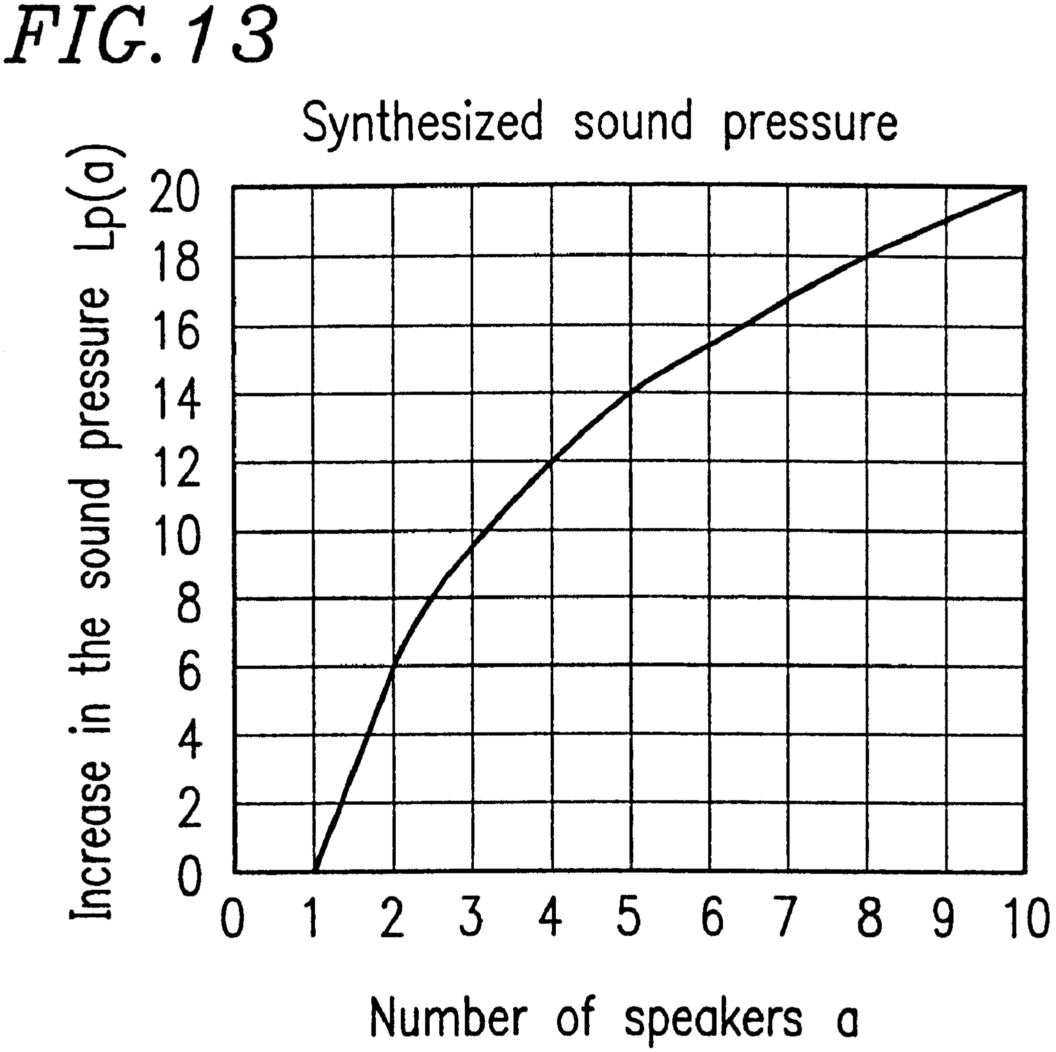
FIG. 13 is a graph illustrating the relationship between the number of speakers and an increase in sound pressure.

In this case, an even-numbered speaker and an odd-numbered speaker are located so that opposing faces of the even-numbered speaker and the odd-numbered speaker output sounds of an identical phase. By locating the speakers in this manner, the sounds of the identical phase are synthesized and thus the sound pressure is increased. As the number of speakers increases, the sounds of the identical phase are further synthesized and thus the sound pressure is further increased (see FIG. 13).

A structure, in which the opposing faces of an even-numbered speaker and an odd-numbered speaker output sounds of an identical phase, is realized in the following two manners.

In a first manner, even-numbered speakers and odd-numbered speakers having an identical structure are used. An even-numbered speaker and an odd-numbered speaker are located so that a front surface of the even-numbered speaker and a front surface of the odd-numbered speaker face each other, or a rear surface of the even-numbered speaker and a rear surface of the odd-numbered speaker face each other. Then, the even-numbered speaker and the odd-numbered speaker are vibrated with the same phase.

For example, the even-numbered speakers and the odd-numbered speakers can be arranged in this manner as follows. The first (odd-numbered) speaker 101, the second (even-numbered) speaker 103 and the third (odd-numbered) speaker 105 having the same physical structure are used. The first speaker 101, the second speaker 103 and the third speaker 105 are located so that the front surface of the first speaker 101 and the front surface of the second speaker 103 face each other and the rear surface of the second speaker 103 and the rear surface of the third speaker 105 face each other.

The even-numbered speakers and the odd-numbered speakers can be vibrated with the same phase by, for example, supplying electric signals of the same phase to the even-numbered speakers and the odd-numbered speakers.

In a second manner, even-numbered speakers and odd-numbered speakers having an identical structure are used. An even-numbered speaker and an odd-numbered speaker are located so that a front surface of the even-numbered speaker and a rear surface of the odd-numbered speaker face each other, or a rear surface of the even-numbered speaker and a front surface of the odd-numbered speaker face each other. Then, the even-numbered speaker and the odd-numbered speaker are vibrated with opposite phase.

For example, the even-numbered speakers and the odd-numbered speakers can be arranged in this manner as follows. The first speaker 101, the second speaker 103 and the third speaker 105 having the same physical structure are used. The first speaker 101, the second speaker 103 and the third speaker 105 are located so that the front surface of the first speaker 101 and the rear surface of the second speaker 103 face each other and the front surface of the second speaker 103 and the rear surface of the third speaker 105 face each other.

The even-numbered speakers and the odd-numbered speakers can be vibrated with opposite phase by, for example, supplying electric signals of the opposite phase to the even-numbered speakers and the odd-numbered speakers.

Alternatively, in the case where the even-numbered speakers and the odd-numbered speakers are piezoelectric speakers having piezoelectric elements, the even-numbered speakers and the odd-numbered speakers can be vibrated with opposite phase as follows. The even-numbered speakers and the odd-numbered speakers are located so that a polarization direction of the piezoelectric elements of the even-numbered speakers is opposite to a polarization direction of the piezoelectric elements of the odd-numbered speakers, and electric signals of the same phase are supplied to the even-numbered speakers and the odd-numbered speakers.

The shape of the spacers is not limited to the shape of the first spacer 102 and the second spacer 104 described above with reference to FIGS. 1 through 4. Any spacer can be used as long as the spacer can separate an even-numbered speaker and an odd-numbered speaker adjacent thereto from each other so that the even-numbered speaker and the adjacent odd-numbered speaker face each other and sounds of opposite phase output from each of the even-numbered speaker and the odd-numbered speaker are prevented from being synthesized.

The acoustic characteristic of the sound output from each of the first sound path 111 and the second sound path 112 can be varied by adjusting the thickness of the first spacer 102 or the second spacer 104, or the width of the first sound path 111 or the second sound path 112.

In the example described above with reference to FIGS. 1 through 4, the first spacer 102 and the second spacer 104 have an identical shape. The present invention is not limited to this. A plurality of spacers can have different shapes.

In the case of a speaker system according to the present invention including speakers having a different shape from that of the thin speakers described above, spacers having suitable shapes for the speakers are preferably used.

In the above example, the spacers 102 and 104 are generally U-shaped. In the case where the vibrating plate has a circular or other shape, spacers having a suitable shape can be used.

According to the present invention, as described above, an even-numbered speaker and an odd-numbered speaker are located so that opposing faces of the even-numbered speaker and the odd-numbered speaker output sounds of the same phase, and a spacer is used for separating the even-numbered speaker from the odd-numbered speaker adjacent thereto so that the even-numbered speaker and the adjacent odd-numbered speaker face each other. The even-numbered speaker, the adjacent odd-numbered speaker and the spacer for separating these speakers form a sound path, through which sounds output from the opposing faces of the even-number speaker and the adjacent odd-numbered speaker pass. Thus, a sound system, having the same surface area as that of one speaker and still providing a large sound pressure without sounds of opposite phase counteracting each other, is obtained.

2. A Speaker System Including Speakers which are not Piezoelectric Speakers

With reference to FIGS. 1 through 6, speaker systems including piezoelectric speakers as a specific example of speakers have been described. As described above, according to the present invention, the speakers are not limited to piezoelectric speakers. Hereinafter, a speaker system including dynamic speakers as another specific example of speakers will be described.

Figure 7:
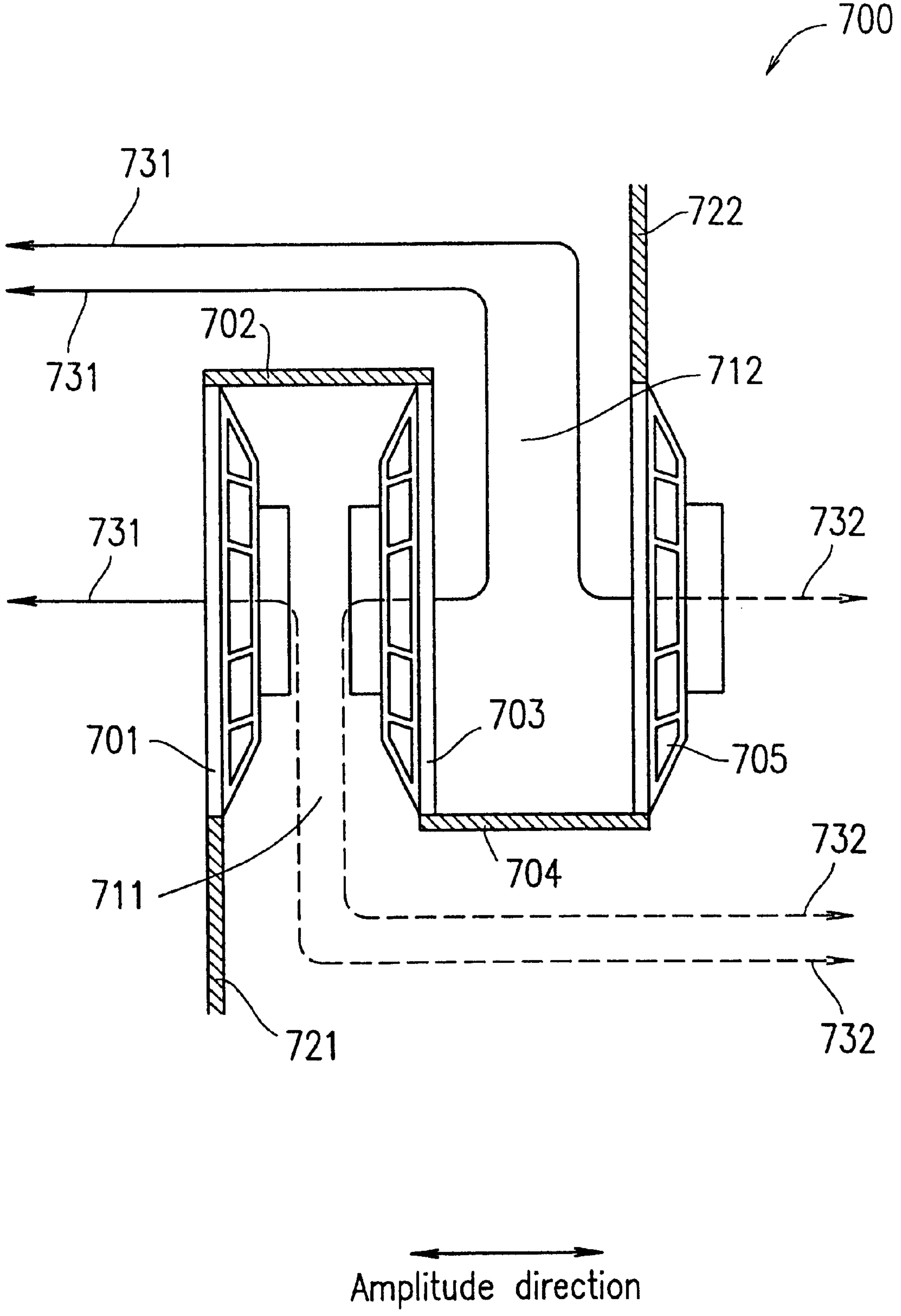
FIG. 7 is a cross-sectional view of a speaker system 700 according to the present invention, including dynamic speakers.

FIG. 7 is a cross-sectional view of a speaker system 700 according to the present invention including dynamic speakers.

The speaker system 700 includes three speakers (a first speaker 701, a second speaker 703 and a third speaker 705) and two spacers (a first spacer 702 and a second spacer 704). The first spacer 702 separates the first speaker 701 and the second speaker 703 from each other so that the first speaker 701 and the second speaker 703 face each other. The second spacer 704 separates the second speaker 703 and the third speaker 705 from each other so that the second speaker 703 and the third speaker 705 face each other.

The first speaker 701, the second speaker 703, and the third speaker 705 vibrate so as to produce sound. The arrows in FIG. 7 labeled "Amplitude direction" show an amplitude direction of vibrations of the first speaker 701, the second speaker 703, and the third speaker 705. The first speaker 701, the second speaker 703, and the third speaker 705 are arranged in the amplitude direction.

Like the speaker system 100, the first speaker 701, the second speaker 703 and the first spacer 702 form a first sound path 711 through which the sounds output from the opposing faces of the first speaker 701 and the second speaker 703 pass.

The second speaker 703, the third speaker 705 and the second spacer 704 form a second sound path 712 through which the sounds output from the opposing faces of the second speaker 703 and the third speaker 705 pass.

The first sound path 711 is formed so that a transfer direction of the sounds passing through the first sound path 711 is perpendicular to the amplitude direction of vibrations of the first speaker 701 and the second speaker 703.

The second sound path 712 is formed so that a transfer direction of the sounds passing through the second sound path 712 is perpendicular to the amplitude direction of vibrations of the second speaker 703 and the third speaker 705.

The sounds output from the opposing faces of the first speaker 701 and the second speaker 703 pass through the first sound path 711, which is a space defined by the first speaker 701, the second speaker 703 and the first spacer 702, and are then transferred to the outside of the speaker system 700 through the missing side of the first spacer 702.

The sounds output from the opposing faces of the second speaker 703 and the third speaker 705 pass through the second sound path 712, which is a space defined by the second speaker 703, the third speaker 705 and the second spacer 704, and are then transferred to the outside of the speaker system 700 through the missing side of the second spacer 704.

Sound output from the left face of the first speaker 701 is transferred in a direction parallel to the amplitude direction of vibrations of the first speaker 701. Sound output from the right face of the second speaker 703 and sound output from the left face of the third speaker 705 are transferred through the second sound path 712. The sounds transferred through the second sound path 712 are directed by the second baffle plate 722 to the direction parallel to the amplitude direction of vibrations of the second speaker 703 and the third speaker 705 (i.e., the same direction as the transfer direction of the sound output from the left face of the first speaker 701). The phase of the sound output from the left face of the first speaker 701 is identical with the phase of the sounds transferred through the second sound path 712.

Therefore, the sound pressure is increased by synthesizing the sound output from the left face of the first speaker 701 and the sounds transferred through the second sound path 712. In FIG. 7, the flow of these sounds is represented by solid lines 731.

Sound output from the right face of the third speaker 705 is transferred in a direction parallel to the amplitude direction of vibrations of the third speaker 705. Sound output from the right face of the first speaker 701 and sound output from the left face of the second speaker 703 are transferred through the first sound path 711. The sounds transferred through the first sound path 711 are directed by the first baffle plate 721 to the direction parallel to the amplitude direction of vibrations of the first speaker 701 and the second speaker 703 (i.e., the same direction as the transfer direction of the sound output from the right face of the third speaker 705). The phase of the sound output from the right face of the third speaker 705 is identical with the phase of the sounds transferred through the first sound path 711.

Therefore, the sound pressure is increased by synthesizing the sound output from the right face of the third speaker 705 and the sounds transferred through the first sound path 711. In FIG. 7, the flow of these sounds is represented by dashed lines 732.

The first baffle plate 721 and the second baffle plate 722 are provided so that the flow of sounds represented by the solid lines 731 and the flow of sounds represented by the dashed lines 732 are not mixed together. Thus, the flow of sounds represented by the solid lines 731 and the flow of sounds represented by the dashed lines 732 are prevented from counteracting each other and thus prevented from reducing the sound pressure.

Figure 8:
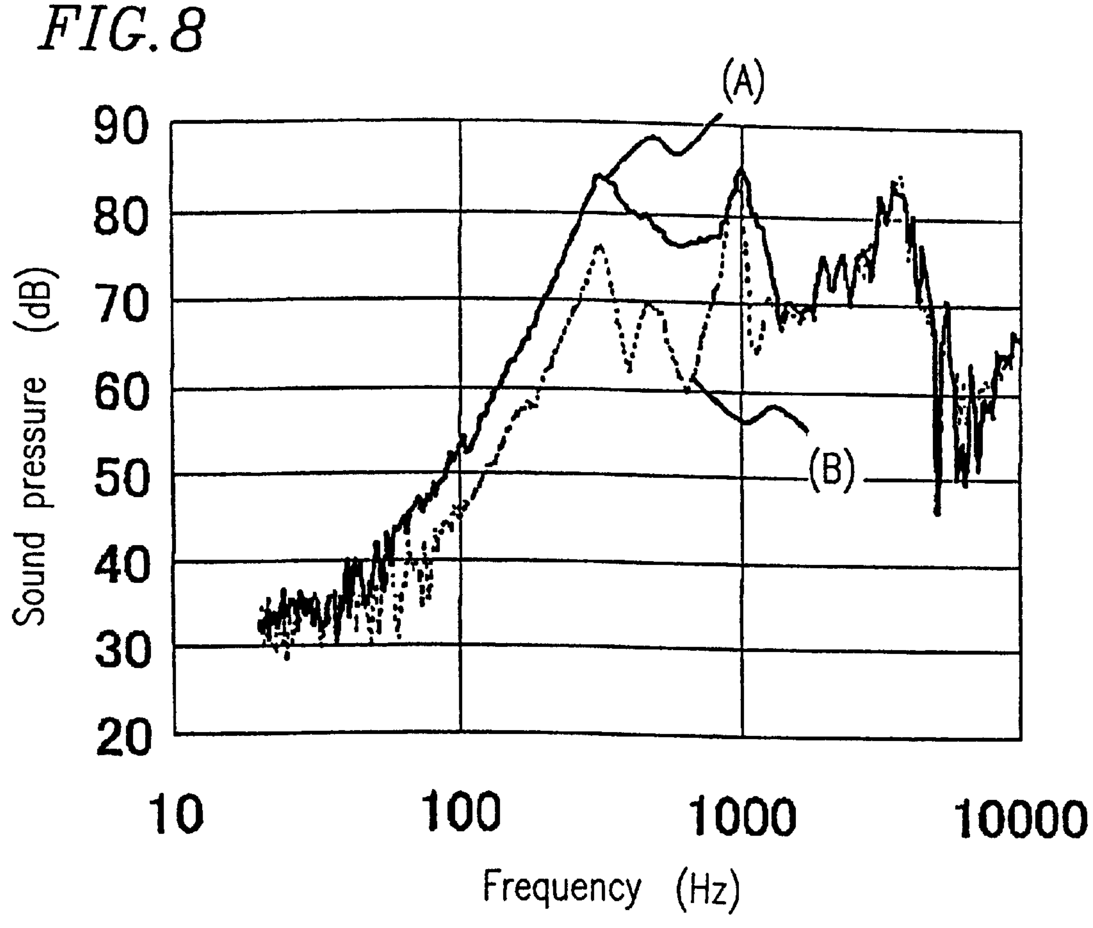
FIG. 8 is a graph illustrating the acoustic characteristics of the speaker system 700 and a dynamic speaker included in the speaker system 700, the acoustic characteristics being measured in a speaker box produced in compliance with a JIS standard.

FIG. 8 is a graph illustrating the acoustic characteristics of the speaker system 700 using the dynamic speakers and one of the speakers included in the speaker system 700 which are measured in a speaker box produced in compliance with a JIS standard. The horizontal axis represents frequency, and the vertical axis represents sound pressure.

In FIG. 8, solid curve (A) represents a pressure-frequency characteristic of the speaker system 700, and dashed curve (B) represents a pressure-frequency characteristic of one of the speakers included in the speaker system 700. For measuring the acoustic characteristics, the speakers in the speaker system 700 are each supplied with a voltage of 0.89 V. The impedance of each speaker is 8Ω.

As can be appreciated from solid curve (A) and dashed curve (B) of FIG. 8, the sound pressure from the speaker system 700 including dynamic speakers is also higher than the sound pressure from the one dynamic speaker almost over the entire frequency range.

3. A Speaker System Including Two Speakers

With reference to FIGS. 1 through 8, speaker systems including three speakers and two spacers have been described. A speaker system according to the present invention is not limited to such a structure. A speaker system according to the present invention can include two speakers and one spacer.

Figure 9:
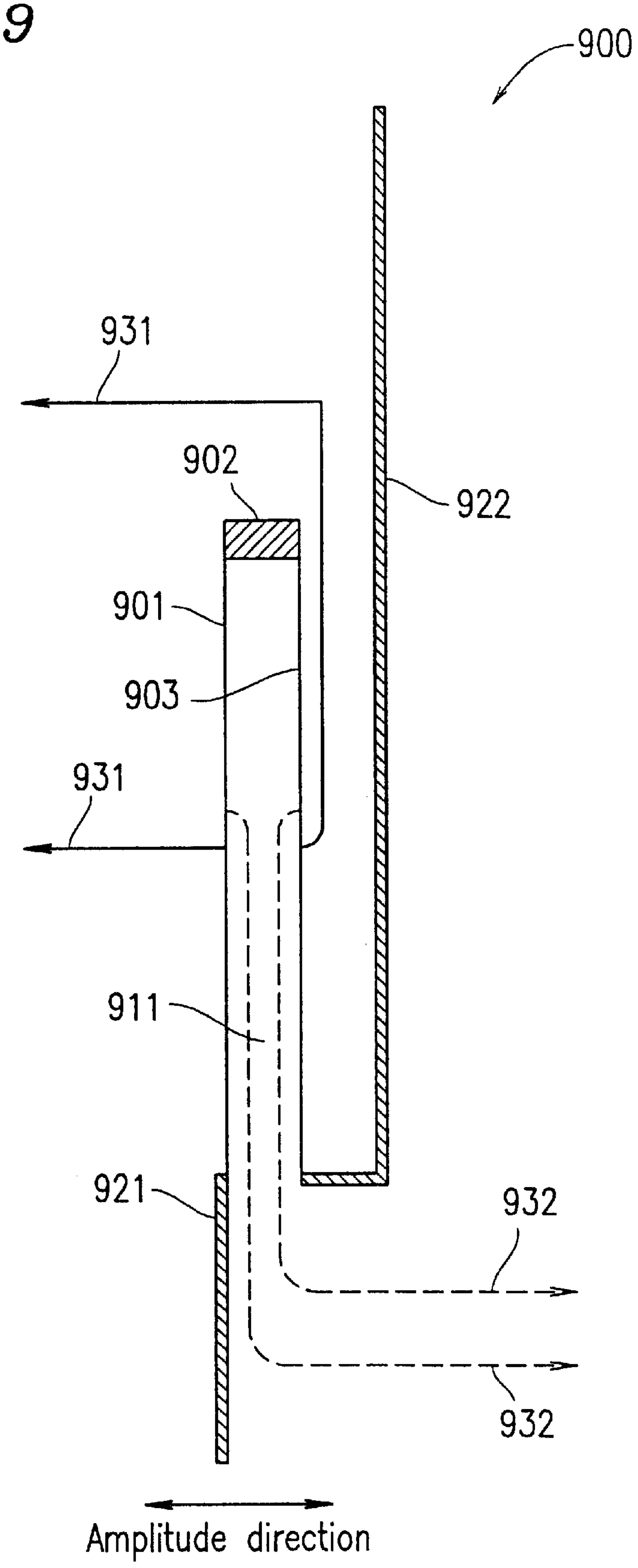
FIG. 9 is a cross-sectional view of a speaker system 900 according to the present invention, including two speakers and one spacer.

FIG. 9 is a cross-sectional view of a speaker system 900 according to the present invention including two speakers and one spacer.

The speaker system 900 includes a first speaker 901, a second speaker 903 and a first spacer 902 for separating the first speaker 901 and the second speaker 903 from each other so that the first speaker 901 and the second speaker 903 face each other.

The first speaker 901 and the second speaker 903 vibrate so as to produce sound. The arrows in FIG. 9 labeled "Amplitude direction" show an amplitude direction of vibrations of the first speaker 901 and the second speaker 903.

The first speaker 901 and the second speaker 903 are arranged in the amplitude direction.

Like the speaker system 100, the first speaker 901, the second speaker 903 and the first spacer 902 form a first sound path 911 through which the sounds output from the opposing faces of the first speaker 901 and the second speaker 903 pass.

The first sound path 911 is formed so that a transfer direction of the sounds passing through the first sound path 911 is perpendicular to the amplitude direction of vibrations of the speakers 901 and 903.

The sounds output from the opposing faces of a first speaker 901 and the second speaker 903 pass through the first sound path 911, which is a space defined by the first speaker 901, the second speaker 903 and the first spacer 902, and are then transferred to the outside of the speaker system 900 through the missing side of the first spacer 902.

The speaker system 900 further includes two baffle plates (a first baffle plate 921 and a second baffle plate 922).

Sound output from the left face of the first speaker 901 is transferred in a direction parallel to the amplitude direction of vibrations of the first speaker 901. Sound output from the right face of the second speaker 903 is directed by the second baffle plate 922 to the direction parallel to the amplitude direction of vibrations of the second speaker 903 (i.e., the same direction as the transfer direction of the sound output from the left face of the first speaker 901). The phase of the sound output from the left face of the first speaker 901 is identical with the phase of the sound output from the right face of the second speaker 903.

Therefore, the sound pressure is increased by synthesizing the sound output from the left face of the first speaker 901 and the sound output from the right face of the second speaker 903. In FIG. 9, the flow of these sounds is represented by solid lines 931.

Sound output from the right face of the first speaker 901 and sound output from the left face of the second speaker 903 are transferred through the first sound path 911. The sounds transferred through the first sound path 911 are directed by the first baffle plate 921 to a direction parallel to the amplitude direction of vibrations of the speakers 901 and 903. In FIG. 9, the flow of these sounds is represented by dashed lines 932.

The first baffle plate 921 and the second baffle plate 922 are provided so that the flow of sounds represented by the solid lines 931 and the flow of sounds represented by the dashed lines 932 are not mixed together. Thus, the flow of sounds represented by the solid lines 931 and the flow of sounds represented by the dashed lines 932 are prevented from counteracting each other and thus prevented from reducing the sound pressure.

As described above, the present invention is applicable to the speaker system 900 including two speakers 901 and 903 and one spacer 902.

The speaker system 600 described above includes three speakers and causes the sounds to be transferred in a direction substantially perpendicular to the amplitude direction of vibrations of the speakers. A speaker system including two speakers can also cause the sounds to be transferred in directions substantially perpendicular to the amplitude direction of vibrations of the speakers.

Figure 10:
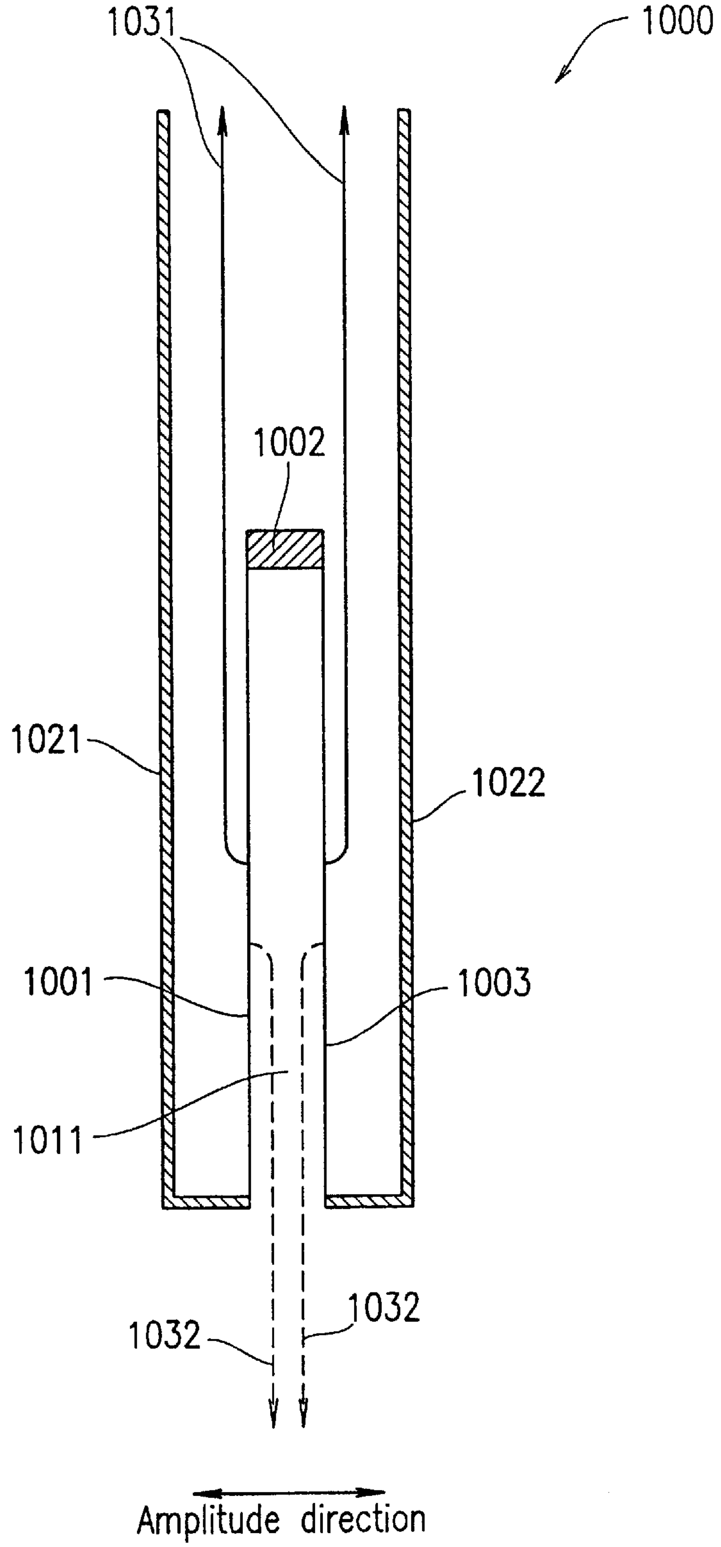
FIG. 10 is a cross-sectional view of a speaker system 1000 according to the present invention including two speakers, in which sounds are transferred in directions perpendicular to the amplitude direction of vibrations of speakers.

FIG. 10 is a cross-sectional view of a speaker system 1000 according to the present invention including two speakers, in which sounds are transferred in directions perpendicular to the amplitude direction of vibrations of the speakers.

The speaker system 1000 includes a first speaker 1001, a second speaker 1003, and a first spacer 1002 for separating the first speaker 1001 and the second speaker 1003 from each other so that the first speaker 1001 and the second speaker 1003 face each other.

The first speaker 1001 and the second speaker 1003 vibrate so as to produce sound. The arrows in FIG. 10 labeled "Amplitude direction" show an amplitude direction of vibrations of the first speaker 1001 and the second speaker 1003. The first speaker 1001 and the second speaker 1003 are arranged in the amplitude direction.

Like the speaker system 100, the first speaker 1001, the second speaker 1003 and the first spacer 1002 form a first sound path 1011 through which the sounds output from the opposing faces of the first speaker 1001 and the second speaker 1003 pass.

The first sound path 1011 is formed so that a transfer direction of the sounds passing through the first sound path 1011 is perpendicular to the amplitude direction of vibrations of the speakers 1001 and 1003.

The sounds output from the opposing faces of the first speaker 1001 and the second speaker 1003 pass through the first sound path 1011, which is a space defined by the first speaker 1001, the second speaker 1003 and the first spacer 1002, and are then transferred to the outside of the speaker system 1000 through the missing side of the first spacer 1002.

The speaker system 1000 further includes two baffle plates (a first baffle plate 1021 and a second baffle plate 1022).

Sound output from the left face of the first speaker 1001 is directed by the first baffle plate 1021 to a direction perpendicular to the amplitude direction of vibrations of the first speaker 1001. Sound output from the right face of the second speaker 1003 is directed by the second baffle plate 1022 to the direction perpendicular to the amplitude direction of vibrations of the second speaker 1003 (i.e., the same direction as the transfer direction of the sound output from the left face of the first speaker 1001). The phase of the sound output from the left face of the first speaker 1001 is identical with the phase of the sound output from the right face of the second speaker 1003.

Therefore, the sound pressure is increased by synthesizing the sound output from the left face of the first speaker 1001 and the sound output from the right face of the second speaker 1003. In FIG. 10, the flow of these sounds is represented by solid lines 1031.

Sound output from the right face of the first speaker 1001 and sound output from the left face of the second speaker 1003 are transmitted through the first sound path 1011. The sounds transmitted through the first sound path 1011 are directed to a direction perpendicular to the amplitude direction of vibrations of the speakers 1001 and 1003. In FIG. 10, the flow of these sounds is represented by dashed lines 1032.

The first baffle plate 1021 and the second baffle plate 1022 are provided so that the flow of sounds represented by the solid lines 1031 and the flow of sounds represented by the dashed lines 1032 are not mixed together. Thus, the flow of sounds represented by the solid lines 1031 and the flow of sounds represented by the dashed lines 1032 are prevented from counteracting each other and thus prevented from reducing the sound pressure.

As described above, sound output from a speaker system 1000 including two speakers can be transferred in a direction perpendicular to the amplitude direction of vibrations of the speakers.

According to the present invention, as described above, a spacer is located so that two speakers face each other, and the speakers and the spacer form a sound path through which sounds output from the opposing faces of the speakers pass. Thus, a sound system, having the same surface area as that of one speaker and still providing a large sound pressure without sounds of opposite phase counteracting each other, is obtained.

4. Structure of a Piezoelectric Speaker

A piezoelectric speaker usable for a speaker system according to the present invention will be described.

Figure 11:
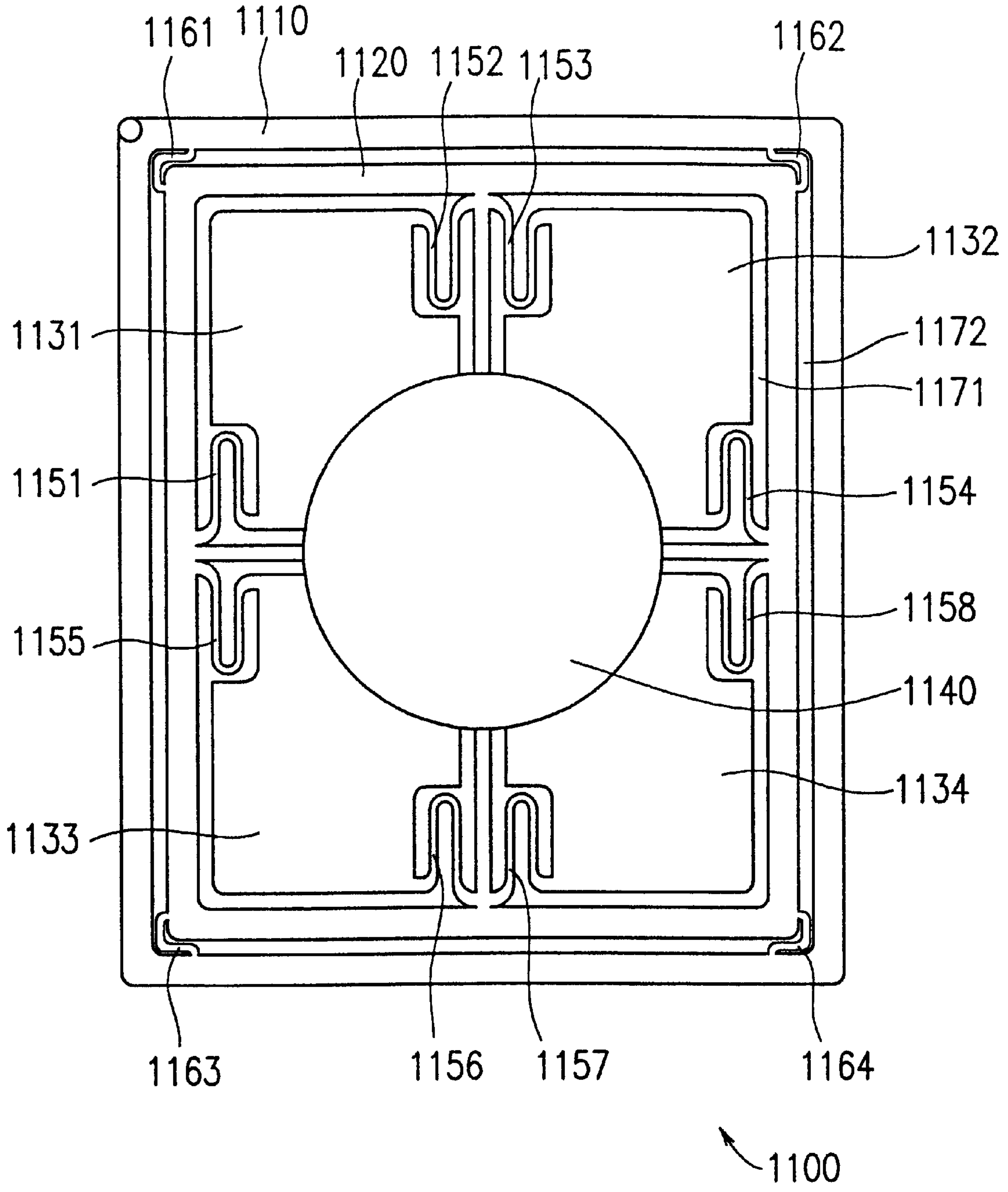
FIG. 11 is a top view of a piezoelectric speaker 1100 usable according to the present invention.
Figure 12:
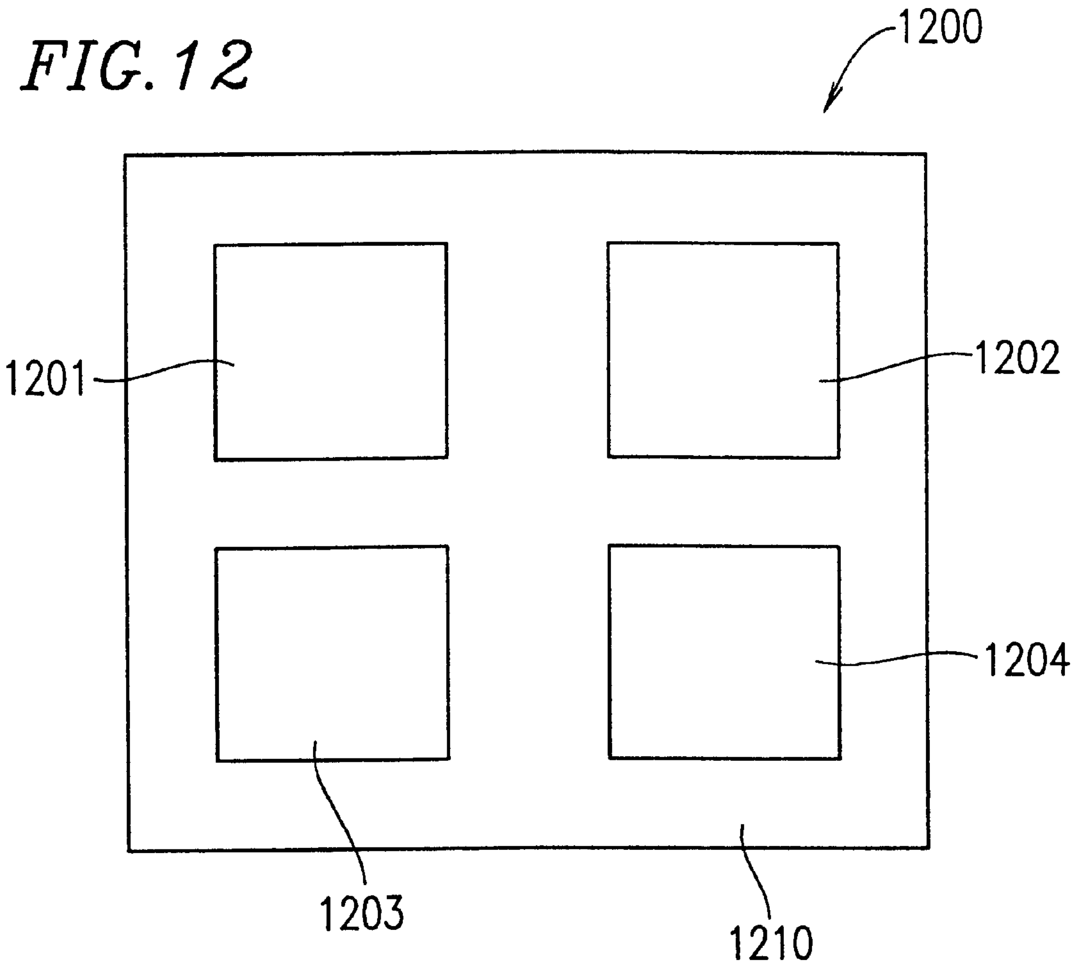
FIG. 12 is a top view of a conventional speaker system 1200 including four speakers.

FIG. 11 is a plan view of a piezoelectric speaker 1100.

The piezoelectric speaker 1100 includes an outer frame 1110, an inner frame 1120, vibrating plates 1131 through 1134, and a piezoelectric element 1140 for transferring an amplitude to the vibrating plates 1131 through 1134.

The vibrating plate 1131 is connected to the inner frame 1120 via dampers 1151 and 1152. The vibrating plate 1132 is connected to the inner frame 1120 via dampers 1153 and 1154. The vibrating plate 1133 is connected to the inner frame 1120 via dampers 1155 and 1156. The vibrating plate 1134 is connected to the inner frame 1120 via dampers 1157 and 1158.

The inner frame 1120 is connected to the outer frame 1110 via dampers 1161 through 1164. The outer frame 1110 is fixed to a fixing member (not shown) of the piezoelectric speaker 1100.

The dampers 1151 through 1158 and the dampers 1161 through 1164 are referred to as "butterfly dampers" due to the shapes thereof.

The dampers 1151 and 1152 support the vibrating plate 1131 so that the vibrating plate 1131 is linearly vibratile. Herein, the expression "the vibrating plate 1131 is linearly vibratile" is defined to refer to "the vibrating plate 1131 vibrates in a direction substantially perpendicular to a reference plane while the plane of the vibrating plate 1131 is maintained substantially parallel to the reference plane". The same definition is applied to the vibrating plates 1132 through 1134. It is assumed that, for example, the outer frame 1110 is fixed to the same plane as the plane of the sheet of FIG. 11 (reference plane). In this case, the vibrating plate 1131 is supported so as to vibrate in a direction substantially perpendicular to the plane of the sheet while the plane of the vibrating plate 1131 is maintained substantially parallel to the plane of the sheet.

Likewise, the dampers 1153 and 1154 support the vibrating plate 1132 so that the vibrating plate 1132 is linearly vibratile. The dampers 1155 and 1156 support the vibrating plate 1133 so that the vibrating plate 1133 is linearly vibratile. The dampers 1157 and 1158 support the vibrating plate 1134 so that the vibrating plate 1134 is linearly vibratile.

The dampers 1161 through 1164 support the vibrating plates 1131 through 1134 so that the vibrating plates 1131 through 1134 are concurrently linearly vibratile.

When the dampers 1151 through 1158 and 1161 through 1164 are formed of a metal material, they are usable as electrode lines. In other words, the piezoelectric element 1140 is electrically connected to the vibrating plates 1131 through 1134. The vibrating plates 1131 through 1134 are connected to the inner frame 1120 via the dampers 1151 through 1158, and the inner frame 1120 is connected to the outer frame 1110 via the dampers and 1161 through 1164. Thus, a signal can be input from the outer frame 1110 to the piezoelectric element 1140.

The piezoelectric speaker 1100 further includes an edge 1171 formed for preventing air from leaking through a gap between the vibrating plates 1131 through 1134 and the inner frame 1120, and an edge 1172 for preventing air from leaking through a gap between the inner frame 1120 and the outer frame 1110. When air leaks through the gap between the vibrating plates 1131 through 1134 and the inner frame 1120 or the gap between the inner frame 1120 and the outer frame 1110, the sounds of opposite phase generated in both of the two sides of the vibrating plates 1131 through 1134 interfere with each other, thus reducing the sound pressure. The edges 1171 and 1172 prevent such air leakage and thus prevent reduction in the sound pressure in a lower frequency range, in which the characteristics would be noticeably deteriorated in the case of air leakage. Therefore, the piezoelectric speaker 1100 according to the present invention can reproduce clear sound in a lower frequency range than conventional piezoelectric speakers.

The edges 1171 and 1172 each act as a part of a supporting member for supporting the vibrating plates 1131 through 1134. By supporting the perimeters of the vibrating plates 1131 through 1134 with the edges 1171 and 1172, the vibrating plates 1131 through 1134 can vibrate more easily. In a structure where the edges 1171 and 1172 do not act as a part of a supporting member for supporting the vibrating plates 1131 through 1134 and the vibrating plates 1131 through 1134 are supported only by the dampers 1151 through 1158 and 1161 through 1164, the vibrating plates 1131 through 1134 are likely to wildly move in undesired directions. As a result, unnecessary resonance is likely to occur.

Even a piezoelectric element of a conventional simple structure including a single metal vibrating plate and an piezoelectric piece attached thereto, instead of the above-described piezoelectric speaker, also provides the effect of increasing the sound pressure.

The piezoelectric speaker 1100 includes quadrangular vibrating plates. The present invention is not limited to this, and circular vibrating plates are also usable, for example.

In the piezoelectric speaker 1100 according to the present invention, the vibrating plates are supported so as to be linearly vibratile, and edges are provided for preventing air from leaking through a gap between the vibrating plates and the frames and also for supporting the vibrating plates to vibrate while being maintained more parallel to the reference plane. Due to such a structure, clear sound can be reproduced in a lower frequency range than in conventional piezoelectric speakers.

In a speaker system according to the present invention, a first speaker and a second speaker are located so that opposing faces of the first speaker and the second speaker output sounds of the same phase. The first speaker, the second speaker and a first spacer form a sound path through which sounds output from the opposing faces of the first speaker and the second speaker pass. Thus, a speaker system for increasing the sound pressure using a plurality of speakers while maintaining the same surface area as that of a single speaker can be provided.

A speaker system according to the present invention is not limited to including two speakers and one spacer. A speaker system according to the present invention can include n number of speakers (where n is an integer equal to or greater than 2) and (n−1) number of spacers. In such a speaker system, an even-numbered speaker and an odd-numbered speaker, among the n number of speakers, are located so that opposing faces of the even-numbered speaker and the odd-numbered speaker output sounds of the same phase. A spacer is provided for separating the even-numbered speaker from the odd-numbered speaker adjacent thereto so that the even-numbered speaker and the odd-numbered speaker adjacent thereto face each other. An even-numbered speaker, an odd-numbered speaker adjacent thereto, and a spacer for separating the even-numbered speaker from the odd-numbered speaker adjacent thereto form a sound path through which sounds output from the opposing faces of the speakers pass. Thus, a speaker system for increasing the sound pressure using a plurality of speakers while maintaining the same surface area as that of a single speaker can be provided.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A speaker system, comprising:

a first speaker;

a second speaker; and a first spacer for separating the first speaker and the second speaker from each other so that the first speaker and the second speaker face each other, the first spacer being substantially U-shaped with an open side, wherein:

the first speaker and the second speaker are located so that Opposing faces of the first speaker and the second speaker output sounds of an identical phase, the first speaker, the second speaker and the first spacer form a first sound path through which the sounds output from the opposing faces of the first speaker and the second speaker pass, and the first sound path being in a direction of the open side of the first spacer, and the first speaker and the second speaker each include:

a frame;

a vibrating plate;

a piezoelectric element provided on the vibrating plate;

a damper connected to the frame and the vibrating plate for supporting the vibrating plate so that the vibrating plate is linearly vibratile; and an edge provided so as to fill a gap between the vibrating plate and the frame, wherein the damper acts as an electrode.

2. A speaker system according to claim 1, wherein the first sound path is formed so that a transfer direction of the sounds passing through the first sound path is perpendicular to amplitude direction of vibrations of the first speaker and the second speaker.

3. A speaker system according to claim 1, further comprising at least one baffle plate, which is provided so that the sounds passing through the first sound path is directed to a direction parallel to the amplitude direction of vibrations of the first speaker and the second speaker.

4. A speaker system according to claim 1, further comprising at least one baffle plate, which is provided so that the sounds passing through the first sound path is directed to a direction perpendicular to the amplitude direction of vibrations of the first speaker and the second speaker.

5. A speaker system according to claim 1, further comprising:

a third speaker; and a second spacer for separating the second speaker and the third speaker from each other so that the second speaker and the third speaker face each other, wherein:

the second speaker and the third speaker are located so that opposing faces of the second speaker and the third speaker output sounds of an identical phase, and the second speaker, the third speaker and the second spacer form a second sound path through which the sounds output from the opposing faces of the second speaker and the third speaker pass.

6. A speaker system according to claim 5, wherein the second sound path is formed so that a transfer direction of the sounds passing through the second sound path is perpendicular to amplitude direction of vibrations of the second speaker and the third speaker.

7. A speaker system according to claim 5, further comprising at least one baffle plate, which is provided so that the sounds passing through the second sound path is directed to a direction parallel to the amplitude direction of vibrations of the second speaker and the third speaker.

8. A speaker system according to claim 5, further comprising at least one baffle plate, which is provided so that the sounds passing through the second sound path is directed to a direction perpendicular to the amplitude direction of vibrations of the second speaker and the third speaker.

9. A speaker system according to claim 5, wherein the first sound path and the second sound path are formed so that the transfer direction of the sounds passing through the first sound path and the transfer direction of the sounds passing through the second sound path are opposite to each other.

10. A speaker system according to claim 1, wherein the first speaker and the second speaker have an identical structure; the first speaker and the second speaker are located so that a front face of the first speaker and a front face of the second speaker face each other or so that a rear face of the first speaker and a rear face of the second speaker face each other; and the first speaker and the second speaker are vibrated with an identical phase.

11. A speaker system according to claim 1, wherein the first speaker and the second speaker have an identical structure; the first speaker and the second speaker are located so that a front face of the first speaker and a rear race of the second speaker face each other or so that a rear face of the first speaker and a front face of the second speaker face each other; and the first speaker and the second speaker are vibrated with opposite phase.

12. A speaker system according to claim 11, wherein the first speaker and the second speaker are each a piezoelectric speaker including a piezoelectric element; a polarization direction of the piezoelectric element of the first speaker is opposite to a polarization direction of the piezoelectric element of the second speaker; and a phase of an electric signal input to the first speaker is identical with a phase of an electric signal input to the second speaker.

13. A speaker system according to claim 11, wherein a phase of an electric signal input to the first speaker is opposite to a phase of an electric signal input to the second speaker.

14. A speaker system according to claim 1, wherein the first speaker and the second speaker are each a dynamic speaker.

15. A speaker system, comprising:

a first speaker;

a second speaker;

a first spacer for separating the first speaker and the second speaker from each other so that the first speaker and the second speaker face each other, the first spacer being substantially U-shaped with an open side, a third speaker; and a second spacer for separating the second speaker and the third speaker from each other so that the second speaker and third speaker face each other, the second spacer being substantially U-shaped with an open side, the open side of the first spacer being disposed opposite from and spaced from the open side of the second spacer, wherein:

the first speaker and the second speaker are located so that opposing faces of the first speaker and the second speaker output sounds of an identical phase, and the first speaker, the second speaker and the first spacer form a first sound path through which the sounds output from the opposing faces of the first speaker and the second speaker pass, and the first sound path being in a direction of the open side of the first spacer.

16. A speaker system according to claim 15, wherein the first sound path is formed so that a transfer direction of the sounds passing through the first sound path is perpendicular to amplitude direction of vibrations of the first speaker and the second speaker.

17. A speaker system according to claim 15, further comprising at least one baffle plate, which is provided so that the sounds passing through the first sound path is directed to a direction parallel to the amplitude direction of vibrations of the first speaker and the second speaker.

18. A speaker system according to claim 15, further comprising at least one baffle plate, which is provided so that the sounds passing through the first sound path is directed to a direction perpendicular to the amplitude direction of vibrations of the first speaker and the second speaker.

19. A speaker system according to claim 15, wherein:

the second speaker and the third speaker are located so that opposing faces of the second speaker and the third speaker output sounds of an identical phase, and the second speaker, the third speaker and the second spacer form a second sound path through which the sounds output from the opposing faces of the second speaker and the third speaker pass.

20. A speaker system according to claim 19, wherein the second sound path is formed so that a transfer direction of the sounds passing through the second sound path is perpendicular to amplitude direction of vibrations of the second speaker and the third speaker.

21. A speaker system according to claim 19, further comprising at least one baffle plate, which is provided so that the sounds passing through the second sound path is directed to a direction parallel to the amplitude direction of vibrations of the second speaker and the third speaker.

22. A speaker system according to claim 19, further comprising at least one baffle plate, which is provided so that the sounds passing through the second sound path is directed to a direction perpendicular to the amplitude direction of vibrations of the second speaker and the third speaker.

23. A speaker system according to claim 19, wherein the first sound path and the second sound path are formed so that the transfer direction of the sounds passing through the first sound path and the transfer direction of the sounds passing through the second sound path are opposite to each other.

24. A speaker system according to claim 15, wherein the first speaker and the second speaker have an identical structure; the first speaker and the second speaker are located so that a front face of the first speaker and a front face of the second speaker face each other or so that a rear face of the first speaker and a rear face of the second speaker face each other; and the first speaker and the second speaker are vibrated with an identical phase.

25. A speaker system according to claim 15, wherein the first speaker and the second speaker have an identical structure; the first speaker and the second speaker are located so that a front face of the first speaker and a rear face of the second speaker face each other or so that a rear face of the first speaker and a front face of the second speaker face each other; and the first speaker and the second speaker are vibrated with opposite phase.

26. A speaker system according to claim 25, wherein the first speaker and the second speaker are each a piezoelectric speaker including a piezoelectric element; a polarization direction of the piezoelectric element of the first speaker is opposite to a polarization direction of the piezoelectric element of the second speaker; and a phase of an electric signal input to the first speaker is identical with a phase of an electric signal input to the second speaker.

27. A speaker system according to claim 25, wherein a phase of an electric signal input to the first speaker is opposite to a phase of an electric signal input to the second speaker.

28. A speaker system according to claim 15, wherein the first speaker and the second speaker each include:

a frame;

a vibrating plate;

a piezoelectric element provided on the vibrating plate;

a damper connected to the frame and the vibrating plate for supporting the vibrating plate so that the vibrating plate is linearly vibratile; and an edge provided so as to fill a gap between the vibrating plate and the frame, wherein the damper acts as an electrode.

29. A speaker system according to claim 15, wherein the first speaker and the second speaker are each a dynamic speaker.

30. A speaker system, comprising:

a first speaker;

a second speaker;

a first spacer for separating the first speaker and the second speaker from each other so that the first speaker and the second speaker face each other, the first spacer being substantially U-shaped with an open side, a third speaker; and a second spacer for separating the second speaker and the third speaker from each other so that the second speaker and third speaker face each other;

the first speaker and second speaker providing a first sound path with a transfer direction, and the second speaker and third speaker providing a second sound path with a transfer direction disposed by 180 degrees from the first sound path, wherein:

the first speaker and the second speaker are located so that opposing faces of the first speaker and the second speaker output sounds of an identical phase.

31. A speaker system according to claim 30, wherein the first sound path is formed so that a transfer direction of the sounds passing through the first sound path is perpendicular to amplitude direction of vibrations of the first speaker and the second speaker.

32. A speaker system according to claim 30, further comprising at least one baffle plate, which is provided so that the sounds passing through the first sound path is directed to a direction parallel to the amplitude direction of vibrations of the first speaker and the second speaker.

33. A speaker system according to claim 30, further comprising at least one baffle plate, which is provided so that the sounds passing through the first sound path is directed to a direction perpendicular to the amplitude direction of vibrations of the first speaker and the second speaker.

34. A speaker system according to claim 30, wherein:

the second speaker and the third speaker are located so that opposing faces of the second speaker and the third speaker output sounds of an identical phase.

35. A speaker system according to claim 34, wherein the second sound path is formed so that a transfer direction of the sounds passing through the second sound path is perpendicular to amplitude direction of vibrations of the second speaker and the third speaker.

36. A speaker system according to claim 34, further comprising at least one baffle plate, which is provided so that the sounds passing through the second sound path is directed to a direction parallel to the amplitude direction of vibrations of the second speaker and the third speaker.

37. A speaker system according to claim 34, further comprising at least one baffle plate, which is provided so that the sounds passing through the second sound path is directed to a direction perpendicular to the amplitude direction of vibrations of the second speaker and the third speaker.

38. A speaker system according to claim 30, wherein the first speaker and the second speaker have an identical structure; the first speaker and the second speaker are located so that a front face of the first speaker and a front face of the second speaker face each other or so that a rear face of the first speaker and a rear face of the second speaker face each other; and the first speaker and the second speaker are vibrated with an identical phase.

39. A speaker system according to claim 30, wherein the first speaker and the second speaker have an identical structure; the first speaker and the second speaker are located so that a front face of the first speaker and a rear face of the second speaker face each other or so that a rear face of the first speaker and a front face of the second speaker face each other; and the first speaker and the second speaker are vibrated with opposite phase.

40. A speaker system according to claim 39, wherein the first speaker and the second speaker are each a piezoelectric speaker including a piezoelectric element; a polarization direction of the piezoelectric element of the first speaker is opposite to a polarization direction of the piezoelectric element of the second speaker; and a phase of an electric signal input to the first speaker is identical with a phase of an electric signal input to the second speaker.

41. A speaker system according to claim 39, wherein a phase of an electric signal input to the first speaker is opposite to a phase of an electric signal input to the second speaker.

42. A speaker system according to claim 39, wherein the first speaker and the second speaker each include:

a frame;

a vibrating plate;

a piezoelectric element provided on the vibrating plate;

a damper connected to the frame and the vibrating plate for supporting the vibrating plate so that the vibrating plate is linearly vibratile; and an edge provided so as to fill a gap between the vibrating plate and the frame, wherein the damper acts as an electrode.

43. A speaker system according to claim 39, wherein the first speaker and the second speaker are each a dynamic speaker.

* * * * *

UNITED STATES PATENT AND TRADEMARK OFFICE

CERTIFICATE OF CORRECTION

PATENT NO. : 6,739,424 B2
DATED : May 25, 2004
INVENTOR(S) : Takashi Ogura and Kosaku Murata It is certified that error appears in the above-identified patent and that said Letters Patent is hereby corrected as shown below:

Column 17,
Line 23, the word "Opposing" should read -- opposing --.

Column 18,
Line 36, the word "race" should read -- face --.

Signed and Sealed this

Twenty-third Day of November, 2004

JON W. DUDAS
*Director of the United States Patent and Trademark Office*